United States Patent [19]

Ueunten

[11] Patent Number: 5,412,309
[45] Date of Patent: May 2, 1995

[54] CURRENT AMPLIFIERS

[75] Inventor: Paul T. Ueunten, San Jose, Calif.

[73] Assignee: National Semiconductor Corporation, Santa Clara, Calif.

[21] Appl. No.: 20,664

[22] Filed: Feb. 22, 1993

[51] Int. Cl.⁶ .......................... G05F 3/16; H03F 3/45
[52] U.S. Cl. .................... 323/316; 323/303; 363/60; 330/257; 330/253
[58] Field of Search ............... 323/316, 303, 281, 275; 363/59, 60; 330/257, 258, 260, 255, 268, 288, 253

[56] References Cited

U.S. PATENT DOCUMENTS

| | | | |
|---|---|---|---|
| 4,405,868 | 9/1983 | Lockwood | 307/296 A |
| 4,543,522 | 9/1985 | Moreau | 323/303 |
| 4,613,809 | 9/1985 | Skovmand | 323/268 |
| 4,638,175 | 1/1987 | Bradford | 307/64 |
| 4,779,037 | 10/1988 | LoCascio | 323/275 |
| 4,803,612 | 2/1989 | Skovmand | 323/284 |
| 4,808,907 | 2/1989 | Main | 323/316 |
| 4,866,312 | 9/1989 | Kearney et al. | 307/496 |
| 4,906,915 | 3/1990 | Abdi | 323/316 |
| 4,920,309 | 4/1990 | Szepesi | 323/269 |
| 5,032,745 | 7/1991 | Izadinia | 307/571 |
| 5,061,902 | 10/1991 | Carpenter | 330/264 |
| 5,081,410 | 1/1992 | Wood | 323/316 |
| 5,103,157 | 4/1992 | Wright | 323/275 |
| 5,223,743 | 1/1993 | Nakagawara | 307/296.1 |

OTHER PUBLICATIONS

Design and Operation of a Fully Integrated BiC/DMOS Head-Actuator PIC for Computer Hard-Disk Drives, Williams et al, IEEE Transactions, vol. 38, Jul. 1991.
Elantec, Inc. 1989–Elantec Data Sheet: High Performance Analog Integrated Circuits Data Sheet/EL2037C Servo Motor Driver, Apr. 1989, Rev. A.
Unitrode Integrated Circuits Data Sheet, Linear Integra Full-Bridge Power, UC3174.

Primary Examiner—Steven L. Stephan
Assistant Examiner—Adolf Berhane
Attorney, Agent, or Firm—Steven F. Caserza; Flehr Hohbach Test Albritton and Herbert

[57] ABSTRACT

A novel power amplifier output stage is taught which provides rail-to-rail output voltage swings, high current source and sink capability, which is capable of class AB operation to provide low distortion amplification. The power amplifier of this invention is suitable for fabrication in integrated circuit form, thereby achieving the small size necessary for use with miniaturized disk drives, as well as low cost and high reliability. A first transistor is driven by the output of a transconductance amplifier, in response to an input control current. The first transistor is configured together with the transconductance amplifier to provide a current which can be sensed and from which a feedback signal is provided to the transconductance amplifier to establish the first current having a known relationship to the input control current. A second transistor is used which is driven by the output of the transconductance amplifier, the second transistor being sized significantly larger than the first transistor, to provide a sizable output current in response to the input control current and with feedback control being provided by the first transistor. Low drop out voltage regulators using the novel current amplifiers of this invention are also taught.

24 Claims, 8 Drawing Sheets

CURRENT AMPLIFIERS

BACKGROUND OF THE INVENTION

This invention pertains to electronic circuits, and more particularly to circuits suitable for fabrication as part of an integrated circuit and capable of providing high current drive.

DESCRIPTION OF THE PRIOR ART

It is often desired to provide a relatively high current drive signal to control certain types of devices, for example a hard disk drive head actuator, which is often provided in the form of a voice coil motor (VCM) which consists of a coil wire suspended in a magnetic field. This coil is mechanically coupled to the read/write head arm of the disk drive. The direction of current flow in the coil accelerates the arm in one direction or the other, in order to place the head on an appropriate track of the disk. Ideally, a high-performance head-actuator circuit would be provided in integrated circuit form, and would feature low impedance rail-to-rail outputs that impart the maximum voltage across the VCM, and would have Class AB output stage to minimize cross-over distortion. Prior art approaches to provide a circuit for controlling the power provided to the VCM have met with one sort of limitation or another.

Figure 1:
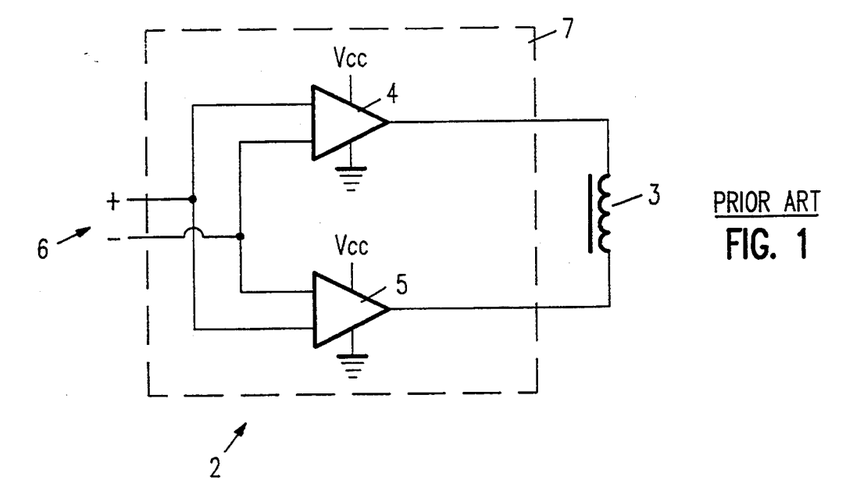
FIG. 1 is a schematic diagram of a typical voice coil motor driven by a pair of operational amplifiers in a bridge configuration.

FIG. 1 is a schematic diagram of typical voice coil motor system including voice coil motor (VCM) 3 and voice coil motor drive electronics 7 which includes a pair of power operational amplifiers 4,5 in a bridge configuration. A positive differential input signal from port 6 will cause the noninverting power amplifier 4 to source current to VCM 3 and the inverting power amplifier to sink current from VCM 3. Conversely, a negative differential input signal from port 6 will cause the noninverting power amplifier 4 to sink current from VCM 3 and the inverting power amplifier to source current to VCM 3. In this manner, VCM 3 can receive substantially +VCC or −VCC across its terminals, causing the disk drive head to be accelerated either inwardly or outwardly along a radius of the disk platter.

Figure 2:
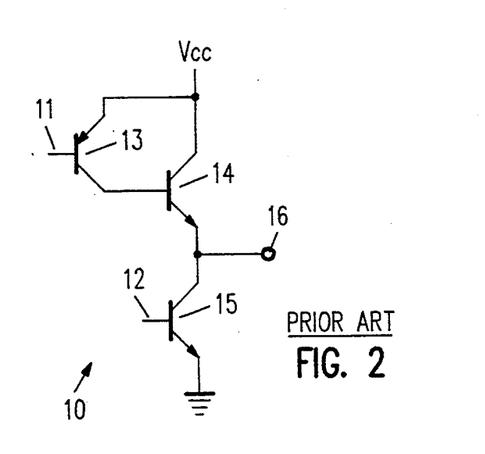
FIGS. 2-5 are schematic diagrams of prior art power amplifier stages.

FIG. 2 is a schematic diagram of an output stage 10 known in the prior art, for example in the Unitrode UC3174 data sheet, suitable for use in the output stages of power amplifiers 4 and 5 of FIG. 1. Output stage 10 includes complementary input terminals 11 and 12 which receive a complementary control signal defining whether output terminal 16 is to source or sink current through NPN output transistors 14 and 15, respectively. PNP transistor 13 provides the base pull up current to NPN pull up transistor 14. A major difficulty of using the prior art circuit of FIG. 2 is that the maximum voice coil motor voltage made available on output terminal 16 is equal to $$V_{VCMMAX} V_{CC} - V_{be} - 2V_{sat} - 2R_c \quad ;(1)$$

wherein $V_{cc}$=supply voltage (typically 12 V);

$V_{be}$=base-emitter voltage drop (typically 0.7 V);

$V_{sat}$=collector to emitter saturation voltage (typically 0.1 V); and $R_c$=collector series resistance of a bipolar transistor.
and thus $V_{VCMmax} \approx V_{cc} - 1.6$ V at 0.8 Amperes.

Figure 3:
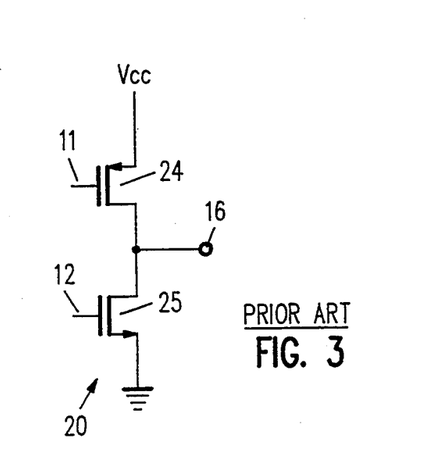

FIG. 3 is a schematic diagram of an alternative prior art power amplifier, which can be used in the output stage of power amplifiers 4 and 5 of FIG. 1, albeit with certain limitations. The circuit of FIG. 3 is described in Williams, R. et al, "Design and Operation of a Fully Integrated BiC/DMOS head Actuator for Computer Hard Disk Drives", IEEE Trans. on Electron Devices, July 1991. P channel pull up transistor 24 operates in opposite phase as N channel pull down transistor 25, in response to the control signals received on input terminals 11 and 12. Unfortunately, P channel transistors have a substantially higher channel impedance than do comparable N channel transistors, and thus P channel transistor 24 must be made significantly larger, perhaps twice as large as N channel transistor 25, in order to provide the same amount of current source capability as N channel transistor 25 current sink capability. This results in a larger integrated circuit die area than if a solution was available utilizing only N channel transistors. Also, the maximum voltage available via output terminal 16 is equal to $$V_{VCMmax} = V_{cc} - 2R_{ds}(on); \quad (2)$$

where $R_{ds}$=the drain to source on resistance of transistors 21 and 22
and thus $V_{VCMmax} \approx V_{cc} - 1.5$ V at 1.0 Ampere.

Figure 4:
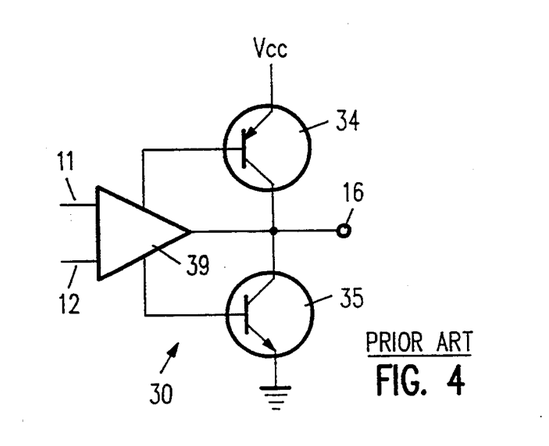

FIG. 4 is a schematic diagram of another prior art alternative shown in the Elantec EL2037 data sheet which can be used in the output stage of power amplifiers 4 and 5 of FIG. 1. Power amplifier circuit 30 of FIG. 4 includes discrete PNP pull up transistor 34, discrete NPN pull down transistor 35, and driver amplifier 39. An obvious disadvantage of this power amplifier 30 is that it must utilize discrete PNP and NPN devices, thereby increasing the cost, manufacturing complexity, and size of such a power amplifier circuit. PNP and NPN discretes are desirable, however, in that their $V_{sat}$ and collector resistance $R_c$ are much smaller than can typically be realized on an integrated circuit. However, these advantages are overweighed by the disadvantages. Also, the maximum voltage available via output terminal 16 is equal to $$V_{VCMmax} = V_{cc} - 2V_{sat} - 2R_c \quad (3)$$

and thus $V_{VCMmax} \approx V_{cc} - 0.6$ V at 1.0 Ampere.

Figure 5:
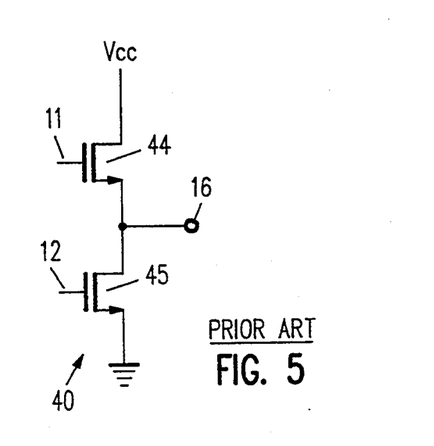

FIG. 5 is another prior power amplifier stage 40 which uses N channel transistors as switches, i.e. either fully on or fully off, to source or sink current to output terminal 16. This alternative avoids the aforementioned difficulties of utilizing P channel transistors, however, power amplifier stage 40 operates in a digital fashion, and thus is not suitable for use as a low distortion power amplifier output stage, and thus not suitable for uses such as driving a VCM. Power amplifier 40 includes pull up N channel transistor 44 and pull down N channel transistor 45 and has a maximum voltage available via output terminal 16 equal to $$V_{VCMmax} = V_{cc} - 2R_{ds}(on) \quad (4$$

and thus $V_{VCMmax} \approx V_{cc} - 0.5$ V at 1.0 Ampere.

SUMMARY

In accordance with the teachings of this invention, a novel power amplifier output stage is taught which provides rail-to-rail output voltage swings, high current source and sink capability, which is capable of class AB operation to provide low distortion amplification. The power amplifier of this invention is suitable for fabrication in integrated circuit form, thereby achieving the small size necessary for use with miniaturized disk drives, as well as low cost and high reliability.

In accordance with the teachings of this invention, a first transistor is driven by the output of a transconductance amplifier, in response to an input control current. The first transistor is configured together with the transconductance amplifier to provide a current which can be sensed and from which a feedback signal is provided to the transconductance amplifier to establish the first current having a known relationship to the input control current. A second transistor is used which is driven by the output of the transconductance amplifier, the second transistor being sized significantly larger than the first transistor, to provide a sizable output current in response to the input control current and with feedback control being provided by the first transistor.

Low drop out voltage regulators using the novel current amplifiers of this invention are also taught.

DETAILED DESCRIPTION

Figures 6, 7:
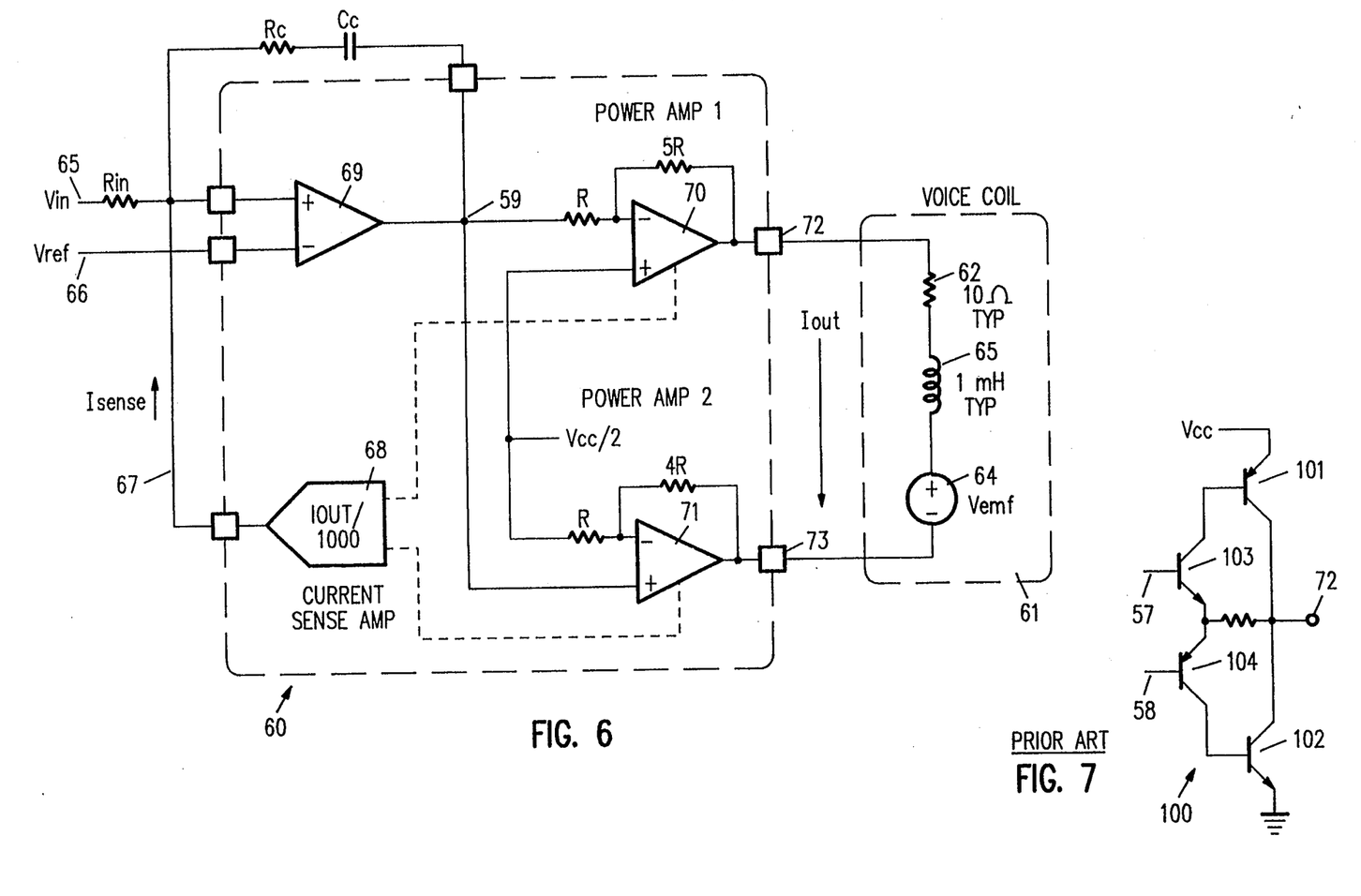
FIG. 6 is a block diagram depicting one embodiment of a power amplifier bridge configuration, including a current sense amplifier, driving a voice coil motor.
FIG. 7 is a model of a power amplifier output stage.

FIG. 6 is a block diagram depicting one embodiment of this invention including driver 60 having power amplifiers and 71 providing output current to voice coil motor (VCM) 61. Voice coil motor 61 includes a voice coil resistance depicted as resistor 62 (typically about 10 ohms), inductance 63 (typically about 1 mH), and reverse EMF generated by the voice coil inductance depicted as voltage source 64 providing $V_{EMF}$. Current driver 60 receives input voltage $V_{IN}$ on lead 65 through an input resistor $R_{IN}$ to the inverting input lead of input signal amplifier 69. A reference voltage $V_{REF}$ is received on lead 66 to the noninverting input lead of input signal amplifier 69. Input signal $V_{IN}$ defines whether a positive or negative current is to be supplied by current driver 60, for example to cause voice coil motor 61 to either extend or retract the disk drive read/write head along a radius of the spinning disk. The output signal from input signal differential amplifier 69 is fed in complementary fashion to the inverting input lead of power amplifier 70 and the noninverting input lead of power amplifier 71. Appropriate feedback resistors and resistor ratios are used in conjunction with power amplifiers 70 and 71 to provide desired gains.

Shown in the embodiment of FIG. 6, current sense amplifier 68 receives a signal from power amplifiers 70 and 71 indicating the amount of current being sourced by power amplifiers 70 and 71. This information is amplified by current sense amplifier 68, for example by a factor of 0.001, and provided to the noninverting input lead of input signal amplifier 69 in order to provide the negative feedback signal. An RC network formed by resistor $R_c$ and capacitor $C_c$ is connected between the inverting input lead and output lead of input signal differential amplifier 69 in order to provide loop stability compensation. In one embodiment of this invention, the elements of current driver circuit 60 are contained in a single integrated circuit, with resistors $R_{IN}$ and $R_c$ and capacitor $C_c$, as well as voice coil motor 61, being separate components.

Output current $I_{OUT}$ may be defined by the following equation:

$$I_{OUT} = 1000 \frac{(V_{IN} - V_{ref})}{R_{IN}} \quad (5)$$

By way of example, given a typical resistor value of approximately 2500 ohms for $R_{IN}$, and a range of (Vin−Vref) of approximately ±2.5 volts, output current $I_{OUT}$ will have a range of approximately ±1 ampere.

In an alternative embodiment of this invention, Current sense amplifier 68 is not used, and a current sense resistor (not shown) is included in the path between voice coil motor 61 and power amplifiers 70 and 71. This current sense resistor, which has been required in conjunction with prior art devices in order to measure the output current, will develop a voltage proportional to the output current, whose voltage can be fed back to the inverting input lead of input signal differential amplifier 69, as desired.

FIG. 7 is a schematic diagram of a model of one embodiment of a power amplifier output stage which can be used in power amplifiers 70 and 71 of the embodiment of FIG. 6. Power amplifier 100 of FIG. 7 receives control signals on terminals 57 and 58, in response to the signal on output terminal 59 of input signal differential amplifier 69 of FIG. 6. PNP transistor 101 and NPN transistor 103 form a composite NPN wherein the output current made available on output terminal 72 is defined as follows:

$$I_{OUT} = I_{57} \beta_{103} \beta_{101}; \quad (6)$$

where $I_{OUT}$ = the output source current through PNP transistor 101 to output terminal 72;
$I_{57}$ = the current fed into the base of NPN transistor 103;
$\beta_{103}$ = the beta (current gain) of NPN transistor 103; and
$\beta_{101}$ = the beta (current gain) of PNP transistor 101.

Similarly, PNP transistor 104 and NPN transistor 102 form a PNP composite providing an output current defined as $$I_{OUT} = I_{58}\beta_{104}\beta_{104}; \quad (7)$$

where $I_{OUT}$=the output sink current through NPN transistor 102 from output terminal
$I_{58}$=the current fed into the base of PNP transistor 104;
$\beta_{102}$=the beta (current gain) of NPN transistor 103; and
$\beta_{104}$=the beta (current gain) of PNP transistor 104.

The use of a composite NPN equivalent and a composite PNP equivalent provide a high current gain and good voltage stability on output terminal 72 in that a high frequency feedback path is provided to help maintain the desired output voltage even in the face of externally applied signals on the output terminal.

Figure 8:
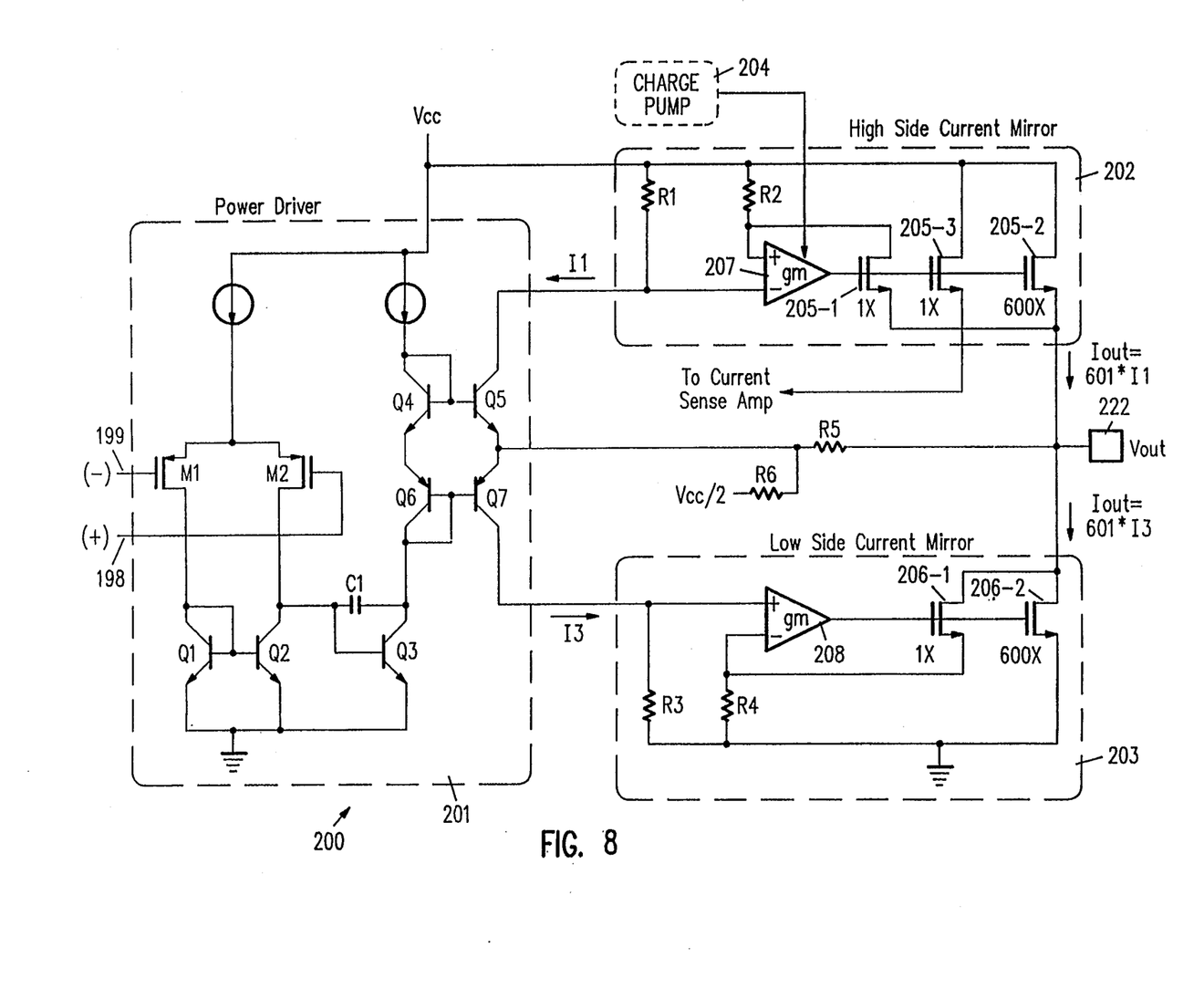
FIG. 8 is a schematic diagram depicting one embodiment of a circuit constructed in accordance with the teachings of this invention.

FIG. 8 is a schematic diagram of one embodiment of a circuit constructed in accordance with the teachings of this invention corresponding to the model described above with respect to FIG. 7, and which is suitable for use as the output stage of power amplifiers 70 and 71 of FIG. 6. In other words, two copies of the circuit 200 of FIG. 8 are required, one copy serving as power amplifier 70 and the other copy serving as power amplifier 71. Circuit 200 includes input operational amplifier 201 which operates in a conventional fashion by receiving a differential input signal on the gates of input transistors M1 and M2 via leads 199 and 198 and providing an output current I$_1$ or I$_3$ from output transistors Q5 and Q7, respectively. Transistors Q5 and Q7 form a class AB NPN/PNP output stage which is desirable in order to minimize crossover distortion.

In one embodiment, high side current mirror 202 uses charge pump 204 (which may be manufactured in any convenient manner, as is well in the art) in order to provide a voltage to transconductance amplifier 207 which is in excess of supply voltage Vcc. In one embodiment, charge pump 204 provides a pump voltage of approximately 22.5 volts, when supply voltage Vcc is approximately 12 volts. The use of this pump voltage via charge pump 204 allows the gate of N channel power transistor 205-2 to have its gate driven above Vcc by transconductance amplifier 207, allowing N channel pull up transistor 205-2 to turn on fully and provide as low a voltage drop across its channel as possible. In one embodiment of this invention, power transistors 205-2 and 206-2 are DMOS N channel transistors, having a threshold of approximately 3 volts. In order to turn on pull up power transistor 205-2 fully, its gate voltage must be driven substantially above supply voltage Vcc, which is achieved by the use of charge pump 204.

Current drive circuit 200 also includes low side current mirror 203, which need not utilize charge pump 204, as the gate of pull down power transistor 206-2 will be driven substantially above ground when it is driven close to Vcc by transconductance amplifier 208 when current is to be sunk by low side current mirror 203.

Referring to FIG. 7, high side current mirror 202 of FIG. 8 is modeled by PNP transistor 101, with transistor Q5 of FIG. 8 being modeled by transistor 103 of FIG. 7. Similarly, low side current mirror 203 of FIG. 8 is modeled by NPN transistor 102 of FIG. 7, with PNP transistor 104 of FIG. 7 modeling PNP transistor Q7 of FIG. 8. N channel power transistors 205-2 and 206-2 have a low channel impedance, for example in one embodiment these transistors have an R$_{ds}$ (on) of approximately 0.25 ohms.

TABLE 1

| 198 | 199 | M1 | M2 | Q1 | Q2 | Q3 | Q4 | Q5 | Q6 | Q7 | I1 | I3 | V222 |
|---|---|---|---|---|---|---|---|---|---|---|---|---|---|
| HIGH | LOW | ON | OFF | ON | ON | OFF | OFF | ON | OFF | OFF | ON | OFF | SOURCE |
| LOW | HIGH | OFF | ON | OFF | OFF | ON | ON | OFF | ON | ON | OFF | ON | SINK |

Referring again to FIG. 8, Table 1 depicts, in general form, the polarity of signals during the operation of current drive circuit 200 in response to differential signals applied to noninverting and inverting input leads 198 and 199. It is to be understood, however, that current drive circuit 200 is preferably made to operate in a linear rather than a digital fashion in order to provide a low distortion output signal. With a high signal applied to noninverting input lead 198 and thus a low input signal applied to inverting input lead 199, transistor M1 turns on and transistor M2 turns off, causing transistors Q1 and Q2 to turn on and transistor Q3 to turn off. With transistor Q3 off, transistors Q4, Q6, and Q7 turn off, and transistor Q5 turns on, causing current I$_1$ to flow. At this time, with transistor Q7 off current I$_3$ does not flow. (In one embodiment, which operates as a class AB amplifier, transistor Q7 is not quite off at this time, and a negligible amount of I$_3$ current flows at this time). As a result of current I$_1$ flowing from high side current mirror 202 and current I$_3$ not flowing to low side current mirror 203, high side current mirror 202 sources current to output terminal 222. Transconductance amplifier 207 has a high input impedance and resistors R1 and R2 are approximately equal and, in one embodiment, each are approximately 100 ohms. Thus, N channel transistor 205-1, whose gate is driven by transconductance amplifier 207, will provide a portion of output source current I$_{OUT}$ which is equal to I$_1$. N channel power transistor 205-2 has its gate also driven by transconductance amplifier 207, and its drain connected to supply voltage Vcc. In one embodiment, its channel is sized to provide 600 times more current than does N channel transistor 205-1, and thus when high side current mirror 202 sources current to output terminal 222, I$_{OUT}$=601×I$_1$. If desired, N channel current sense transistor 205-3 is used, having its gate also driven by transconductance amplifier 207. Current sense transistor 205-3 may be sized in any convenient manner, and in the embodiment shown is the same size as transistor 205-1 and thus provides the same output current as N channel transistor 205-1, which is fed to a current sense amplifier (not shown) to monitor the current sourced by high side current 202 without the need for current sense resistor, as required in the prior art. In this embodiment, current sense transistor 205-3 provides a current sense signal where I$_{SENSE}$=I$_{OUT}$/601.

Conversely, with a low signal applied to noninverting input lead 198 and thus a high input signal applied to inverting input lead 199, transistor M1 turns off and transistor M2 turns on, causing transistors Q1 and Q2 to turn off and transistor Q3 to turn on. With transistor Q3 on, transistors Q4, Q6, and Q7 turn on, and transistor Q5 turns off, causing current I$_3$ to flow. At this time, with transistor Q5 off current I$_1$ does not flow. (In the embodiment which operates as a class AB amplifier, transistor Q5 is not fully off, and a negligible amount of $I_1$ current flows). As a result of current $I_3$ flowing from low side current mirror 203 and current $I_1$ not flowing to high side current mirror 202, low side current mirror 203 sinks current from output terminal 222. Transconductance amplifier 208 has a high input impedance and resistors R3 and R4 are approximately equal and, in one embodiment, each are approximately 100 ohms. Thus, N channel transistor 206-1, whose gate is driven by transconductance amplifier 208, will provide a portion of output sink current $I_{OUT}$ which is equal to $I_3$. N channel power transistor 206-2 has its gate also driven by transconductance amplifier 208, and its drain connected to supply voltage ground. In one embodiment, its channel is sized to provide 600 times more current than does N channel transistor 206-1, and thus when low side current mirror 203 sinks current from output terminal 222, $I_{OUT}=601\times I_3$.

The use of resistors R5 and R6 connected to a circuit node of approximately one half of supply voltage Vcc provides a complete current path for current $I_1$ through Q5 when transistor Q7 is turned off (or nearly off, during class AB operation), and a complete current path for current $I_3$ through transistor Q7 when transistor Q5 is turned off (or nearly off, during class AB operation). The use of low impedance transistors 205-2 and 206-2 in conjunction with the charge pump voltage in excess of Vcc provided by charge pump 204, allows the output voltage $V_{OUT}$ applied to output terminal 202 to go to substantially Vcc when high side current mirror 202 is sourcing current, and to substantially zero volts (ground) when low side current mirror 203 is sinking current.

One major improvement in the use of current mirror amplifiers 202 and 203 as taught by this invention, as compared with the use of PNP and NPN equivalents as described with reference to FIG. 7, is that the current gains of current mirror amplifiers 202 and 203 are completely insensitive to process variations and significantly more insensitive to temperature operating condition variations due to their use of negative feedback via transistors 205-1 and 206-1. This allows for much tighter control of the output stage performance.

Figure 9:
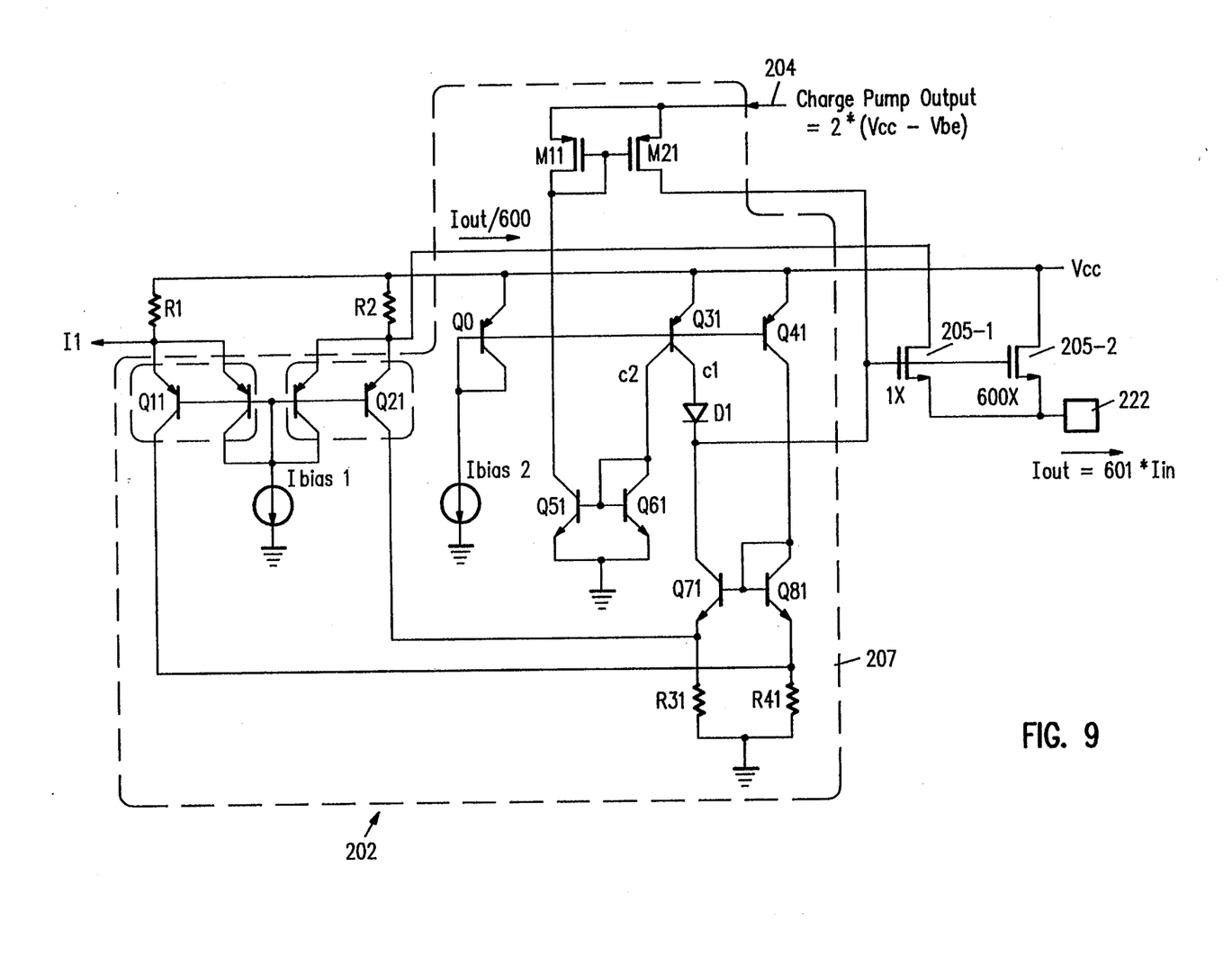
FIG. 9 is a schematic diagram of one embodiment of a high side current mirror circuit constructed in accordance with the teachings of this invention.

FIG. 9 is a schematic diagram of one embodiment of a circuit suitable for use as high side current mirror 202, which is depicted in FIG. 9 without the inclusion of current sense transistor 205-3 of FIG. 8. The circuitry shown in the schematic of FIG. 9 within the dashed line corresponds to one embodiment of transconductance amplifier 207 of FIG. 8. Transistors Q11, Q21 and resistors R1 and R2 serve to level shift input current $I_1$ and the $I_{OUT}/600$ current conducted by N channel transistor 205-1 to the emitters of NPN transistors Q81 and Q71, respectively. By this level shifting, the voltages developed by these currents, with respect to supply voltage Vcc, on the emitters of transistors Q11 and Q21, are shifted to the emitters of transistors Q81 and Q71, respectively, with the voltages now being offset from ground, rather than Vcc. Transistors Q31, Q41, Q71, and Q81 serve as transconductance amplifier 207, receiving the input voltage from the emitters of transistors Q71 and Q81. The collector of transistor of Q71 serves as the output lead of transconductance amplifier 207 which drives the gates of output transistors 205-1 and 205-2. The dominant pole this circuit is set by the gate capacitance of transistors 205-1 and 205-2, the gain of transconductance amplifier 207, the transconductance gain of transistors 205-1 and 205-2, and the value of resistor R2.

Figure 9A:
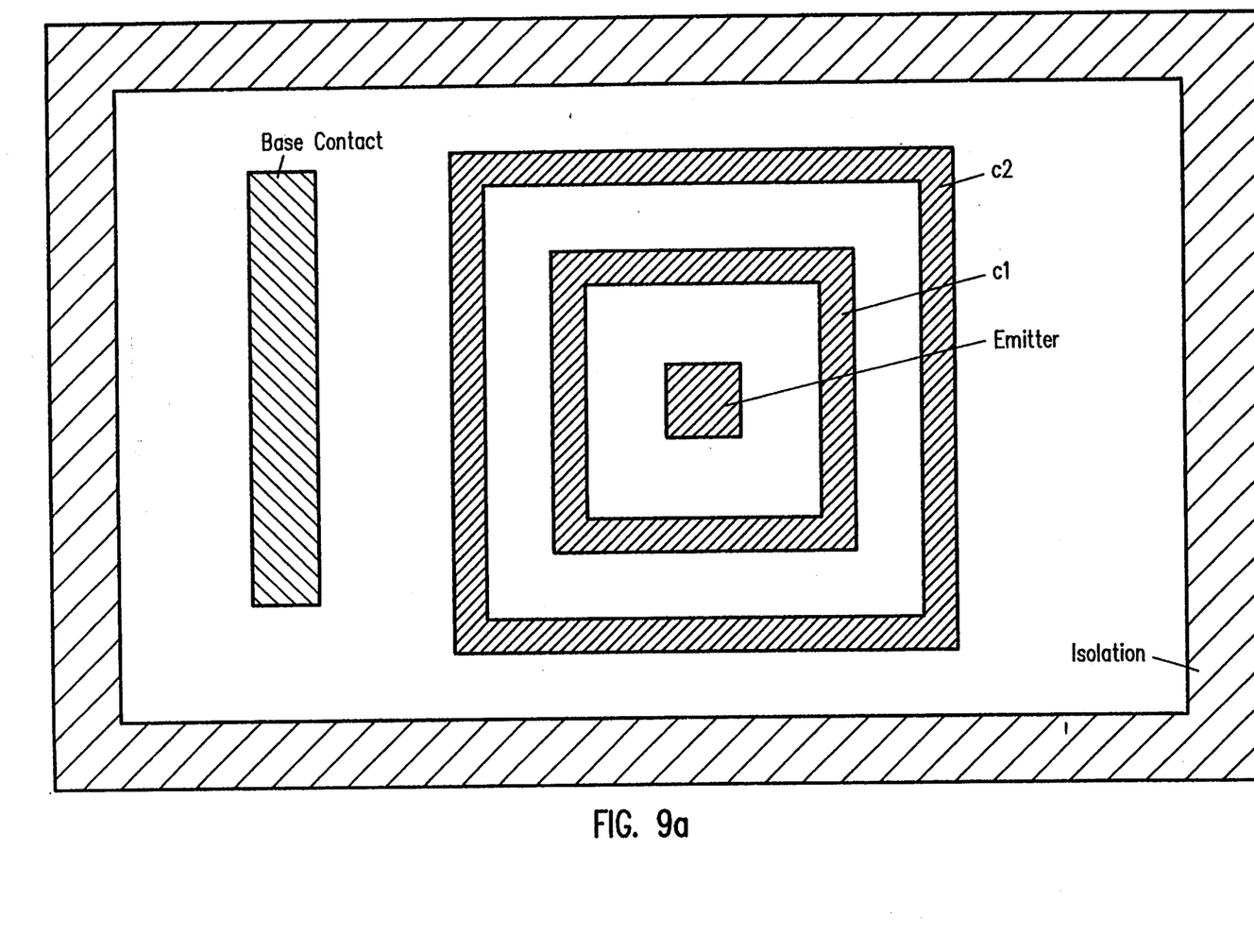
FIG. 9a is a plan view of a dual collector transistor suitable for use as transistor Q31 of FIG. 9.

FIG. 9a is a plan view of a dual collector transistor suitable for use as dual collector transistor Q31 of FIG. 9, in which collectors C1 and C2 are inner and outer concentric collectors surrounding the emitter of transistor Q31. When the gate voltage of transistors 205-1 and 205-2 is well below supply voltage Vcc, current is supplied through collectors C1 of dual collector PNP transistor Q31 through diode D1 to drive the gates of transistors 205-1 and 205-2. A rising output voltage on output terminal 222 causes the gate voltages of transistors 205-1 and 205-2 to approach Vcc, eventually causing diode D1 to reverse bias and thus causing collector C1 of transistor Q31 to saturate. As collector C1 of transistor Q31 saturates, collector C2 of transistor Q31 collects the emitter current of transistor Q31, which is routed to transistor Q61 to ground. The switch point for this current being collected by collector C2 of transistor Q31 rather than collector C1 of transistor Q31 is equal to $$V_{SW}=V_{out}+V_{GS}\approx V_{cc}-V_D-V_{sat} \qquad (8)$$

where
$V_{SW}=$is the switch point for collector C2 collecting current rather than collector C1;
$V_{OUT}=$the output voltage on output terminal 222;
$V_{GS}=$the threshold voltage of transistors 205-1 and 205-2 plus its overdrive;
$V_D=$is the forward bias voltage drop of diode D1; and
$V_{SAT}=$is the collector C1 to emitter saturation voltage of transistor Q31.

Transistor Q51 mirrors the current flowing in transistor Q61 and causes this mirrored current to also flow through P channel MOS transistor M11, which in turn causes a mirrored current to flow through P channel MOS transistor M21. This mirrored current flowing through transistor M21 is applied to the gates of output transistors 205-1 and 205-2, from charge pump 204 which is in excess of supply voltage Vcc. Thus a continuous current source is available to the gate of transistors 205-1 and 205-2 from ground to the charge pump voltage, which is almost twice the supply voltage Vcc.

As a unique feature of this invention, the application of charge pump current from charge pump 204 to the gates of output transistors 205-1 and 205-2 is controlled in this manner so that the same charge pump can supply such gate voltage to the high side current mirror 202 of both power amplifiers 70 and 71, as only one of the power amplifiers will have the gate of its power transistor 205-2 be at the charge pump voltage, in excess of Vcc, at any given time. This results in a minimization of charge pump current requirements, and thus the integrated circuit die area which must be allocated for the charge pump.

Figure 10:
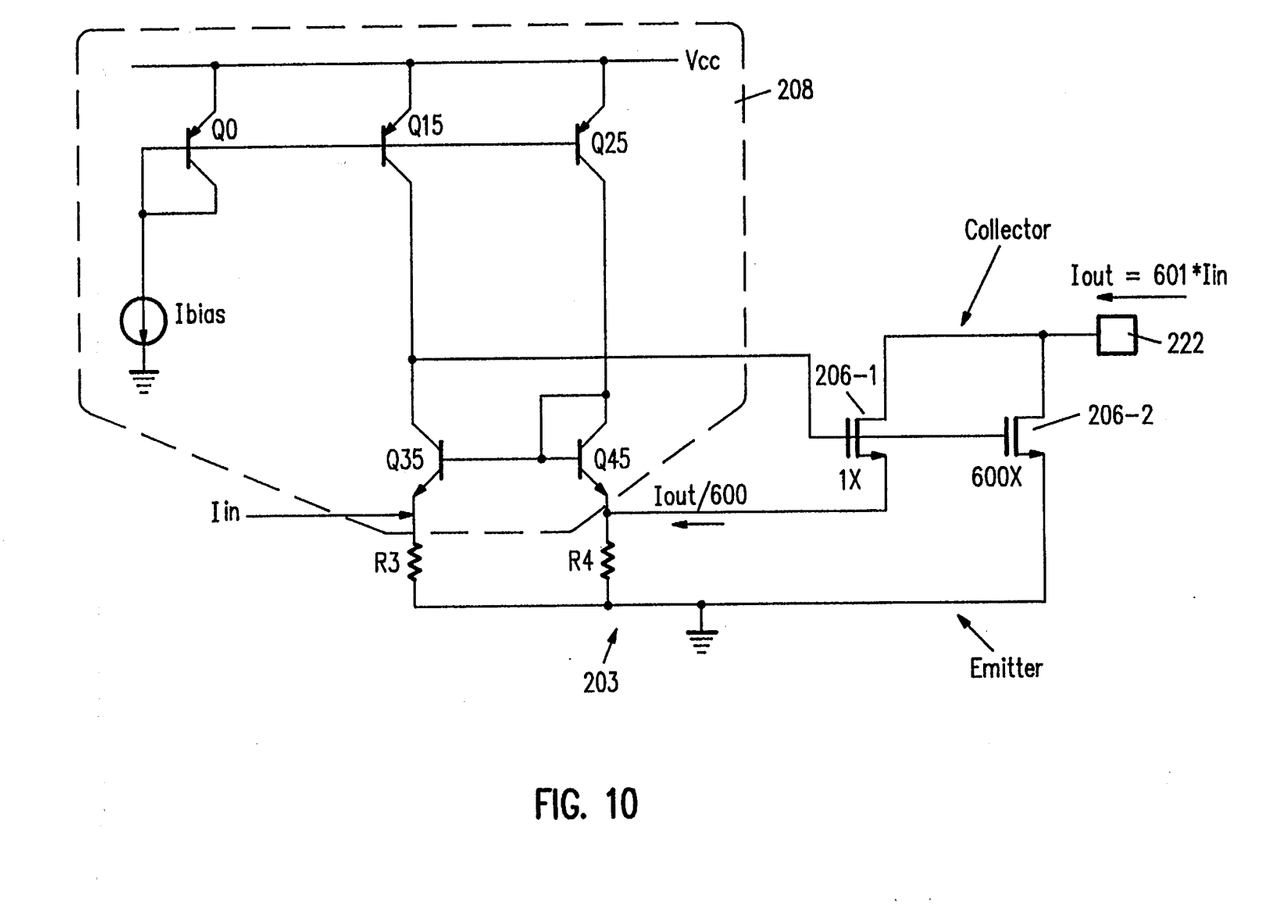
FIG. 10 is a schematic diagram of one embodiment of a low side current mirror circuit constructed in accordance with the teachings of this invention.

FIG. 10 is a schematic diagram of one embodiment of low side current mirror 203 of FIG. 8. Transistors Q15, Q25, Q35, and Q45 form transconductance amplifier 208, with the emitters of transistors Q35 and Q45 serving as the differential input leads of transconductance amplifier 208. The collectors of transistors Q15 and Q35 form the output lead of transconductance amplifier 208, which drives the gates of output transistors 206-1 and 206-2. The dominant pole of this circuit is set by the gate capacitance of transistors 206-1 and 206-2, the gain of transconductance amplifier 208, the transconductance gains of transistors 206-1 and 206-2, and the value of resistor R4.

Figure 11:
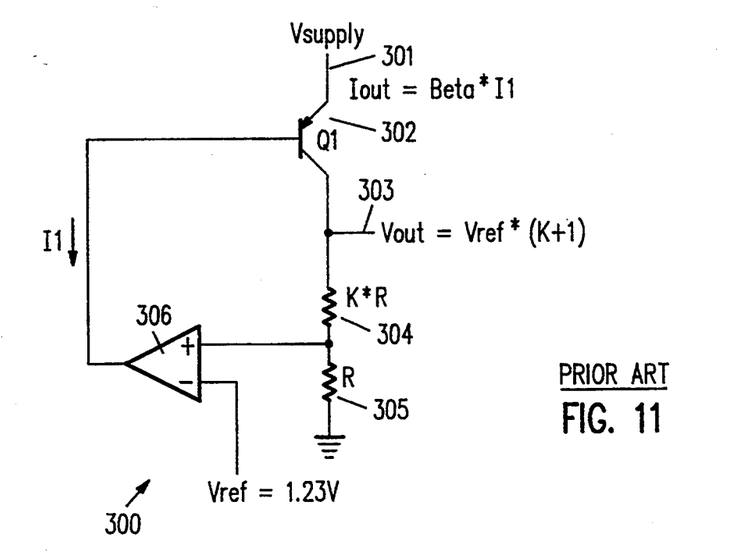
FIG. 11 is a schematic diagram of a typical prior art Low Drop Out (LDO) voltage regulator.

FIG. 11 is a schematic diagram of a prior art low drop out (LDO) voltage regulator 300. Regulator 300 receives a supply voltage $V_{supply}$ on lead 301, which is applied to the emitter of PNP transistor 302. The collector of transistor 302 is connected to output lead 303 of regulator 300, and to the voltage divider formed of resistors 304 and 305, between output lead 303 and ground. The divided voltage provided by the voltage divider is fed to the noninverting input lead of differential amplifier 306, which receives a reference voltage on its noninverting input lead. The output lead of differential amplifier 306 is connected to the base of PNP transistor 302, thus providing the control current which establishes the output voltage on output lead 303.

Unfortunately this prior art type of LDO voltage regulator has serious drawbacks. First, the high current beta of PNP transistors are poor (typically less than 40), and thus the power efficiency suffers due to the power loss of the device, which is proportional to the base current times ($V_{supply} * I_{out}$/beta). Secondly, PNP transistor 302 has inherently poor $V_{sat}$ characteristics, since it is a bipolar device. This makes it difficult to realize a low voltage drop between $V_{supply}$ to $V_{out}$. Furthermore, PNP transistors inherently consume a large amount of integrated circuit die area for a given current carrying capacity.

Figure 12:
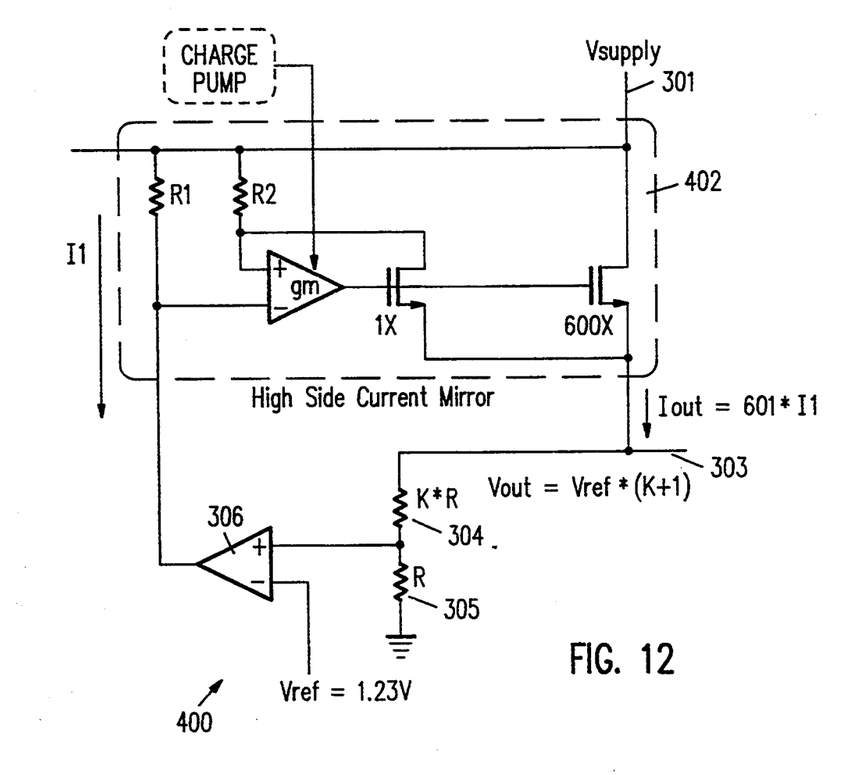
FIG. 12 is a schematic diagram of one embodiment of an LDO voltage regulator constructed in accordance with the teachings of this invention.

FIG. 12 is a schematic diagram of one embodiment of an LDO voltage regulator constructed using a novel current mirror as taught by this invention. Similar reference numerals are used for components similar to those in the prior art circuit of FIG. 11, with the novel current amplifier 402 being used in accordance with this invention instead of PNP transistor 302 of FIG. 11. The operation of current amplifier 402 is similar to the operation of current mirror 202 of FIG. 8, including the use of a charge pump if desired. The use of current mirror 402 rather than a PNP transistor improves integrated circuit area efficiency for a given current carrying capacity, and provides significantly higher gain than is provided by the beta of a PNP transistor. Also, the characteristics of current mirror 402 is substantially immune to process variations, as well as variations in operating temperature. The voltage drop between $V_{supply}$ and $V_{out}$ can be maintained extremely low over a wide range of currents, particularly when the charge pump is used to allow the transconductance amplifier to provide gate drive in excess of $V_{supply}$.

Figure 13:
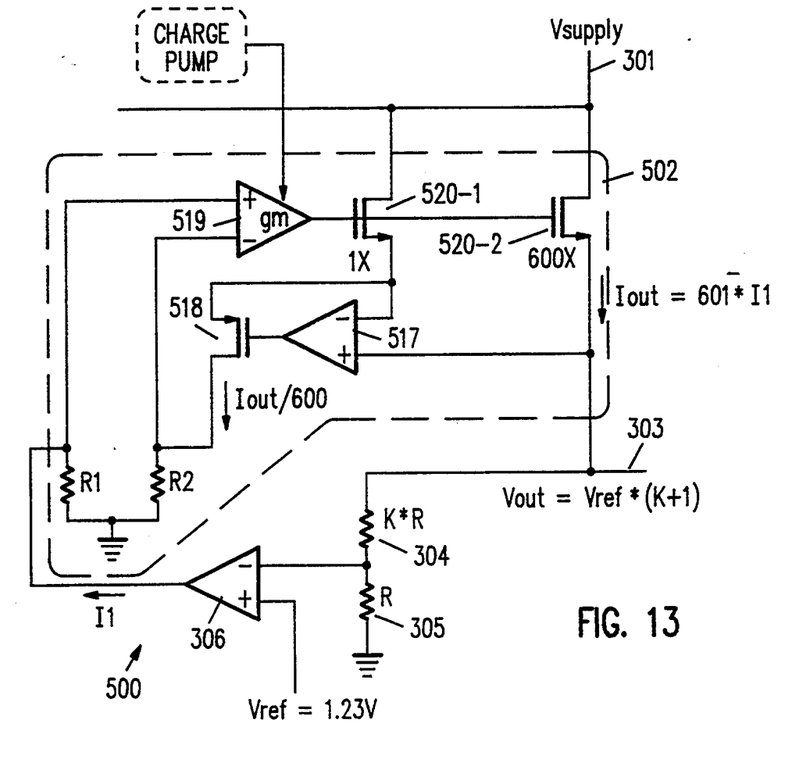
FIG. 13 is a schematic diagram of an alternative embodiment of an LDO voltage regulator constructed in accordance with the teachings of this invention.

FIG. 13 is a schematic diagram of an alternative LDO voltage regulator 500 constructed in accordance with this invention, shown including the optional charge pump. As shown in FIG. 13, resistors R1 and R2 are referenced to ground, rather than $V_{supply}$, as was the case in the embodiment of FIG. 12. Differential amplifier 517 and P channel transistor 518 are used as a current sense amplifier to provide an appropriate control signal to the inverting input lead of transconductance amplifier 519, in relation to the current through transistor 520-1. Transistor 520-2 is sized to provide the desired current carrying capacity of LDO voltage regulator 500.

Figure 14:
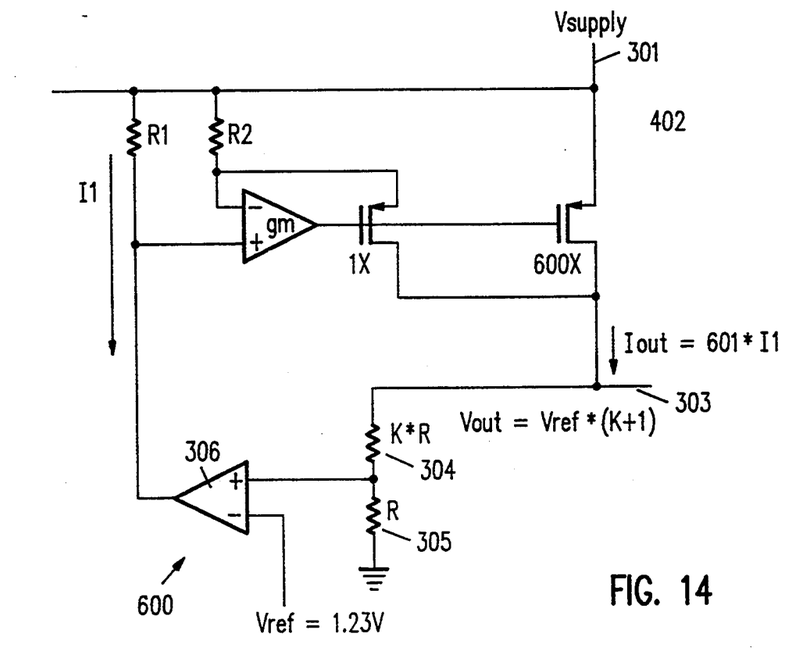
FIG. 14 is a schematic diagram of a P channel embodiment of an LDO voltage regulator constructed in accordance with this invention.

FIG. 14 is a schematic diagram of a P channel embodiment of an LDO voltage regulator 600 constructed in accordance with the teachings of this invention. Its operation is similar to the operation of LDO voltage regulator 400 of FIG. 12, but with certain polarities adapted for use with P channel devices. In this P channel embodiment, a charge pump would not be needed, as in certain alternatives of the N channel embodiments described above, since P channel transistors are assured of adequate overdrive voltage when driven with a gate voltage near ground.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A current amplifier comprising:
   an input lead for receiving an input current to be amplified;
   an output terminal for providing an output current as a function of said input current;
   a first supply voltage lead;
   a second supply voltage lead;
   an anti-shoot through circuit having an input lead coupled to said input lead of said current amplifier, a first output lead coupled to said output terminal of said current amplifier, a second output lead, and a third output lead;
   a pull up circuit comprising:
      a first transconductance amplifier having a first differential input lead coupled to said second output lead of said anti-shoot through circuit, a second differential input lead, and an output lead;
      a first resistor connected between said first differential input lead of said first transconductance amplifier and said first supply voltage lead;
      a second resistor connected between said second differential input lead of said first transconductance amplifier and said first supply voltage lead;
      a first transistor having a first current handling lead coupled to said second differential input lead of said first transconductance amplifier, a second current handling lead connected to draw current through said first transistor, and a control lead coupled to said output lead of said first transconductance amplifier; and
      a second transistor having a first current handling lead coupled to said first supply voltage lead, a second current handling lead connected to said output terminal, and a control lead coupled to said output lead of said first transconductance amplifier; and
   a pull down circuit comprising:
      a second transconductance amplifier, having a first differential input lead coupled to said third output lead of said anti-shoot through circuit, a second differential input lead, and an output lead;
      a third resistor connected between said first differential input lead of said second transconductance amplifier and said second supply voltage lead;
      a fourth resistor connected between said second differential input lead of said second transconductance amplifier and said second supply voltage lead;
      a third transistor having a first current handling lead coupled to said second differential input lead of said second transconductance amplifier, a second current handling lead connected to draw current through said third transistor, and a control lead coupled to said output lead of said second transconductance amplifier; and a fourth transistor having a first current handling lead coupled to said second supply voltage lead, a second current handling lead connected to said output terminal, and a control lead coupled to said output lead of said second transconductance amplifier.

2. A current amplifier as in claim 1 wherein said second current handling lead of said first transistor is coupled to said output terminal.

3. A current amplifier as in claim 1 which further comprises a current sense transistor having a first current handling lead coupled to said first supply voltage lead, a second current handling lead providing a current sense signal indicative of the current supplied by said current amplifier to said output terminal, and a control terminal coupled to said output lead of said transconductance amplifier.

4. A current amplifier as in claim 1 which further comprises a charge pump for providing a pumped supply voltage greater than said first supply voltage, said pumped supply voltage being coupled to power said first transconductance amplifier.

5. A current amplifier as in claim 4 wherein said first transconductance amplifier drives said control terminals of one or both of said first and second transistors to a voltage level in excess of said first supply voltage.

6. A current amplifier as in claim 4 wherein said first transconductance amplifier comprises:
a transistor having a base receiving a bias voltage, an emitter coupled to said first supply voltage lead, a first collector coupled to said output lead of said first transconductance amplifier, and a second collector;
a current path coupled between said first collector and ground, said current path drawing current in response to said input current; and
a current control circuit coupled to said second collector and said charge pump to provide current from said charge pump to said output lead of said first transconductance amplifier in response to current from said second collector.

7. A current amplifier as in claim 1 wherein said first and second transistors source current to said output terminal in response to said input current.

8. A current amplifier as in claim 1 wherein said third and fourth transistors sink current from said output terminal in response to said input current.

9. A current amplifier as in claim 1 wherein said first, second, third, and fourth transistors comprise MOS transistors.

10. A current amplifier as in claim 1 wherein said second current handling lead of said third transistor is coupled to said output terminal.

11. A current amplifier as in claim 6 wherein said second collector of said transistor of said first transconductance amplifier is formed as an outer collector surrounding said first collector and said emitter.

12. A method for operating a current amplifier having an input lead for receiving an input current to be amplified and an output terminal for providing an output current as a function of said input current, first and second supply voltage leads for receiving first and second supply voltages, and first and second transconductance amplifiers, each having a first differential input lead, a second differential input lead, and an output lead, said method comprising the steps of:
providing an anti-shoot through circuit to apply a first set of signals as a function of said input current to said first differential input leads of said first and second transconductance amplifiers;
providing drive signals from each of said output leads of said transconductance amplifiers to a respective one of a first set of transistors, thereby causing said first set of transistors to conduct current to said output terminal;
providing feedback signals to one of said differential input leads of each of said transconductance amplifiers in response to said currents flowing in said first set of transistors, so that said output signals of each of said transconductance amplifiers are set to cause said currents flowing in said first set of transistors to have a first set of selected values; and
providing said drive signals to a respective one of a second set of transistors, thereby causing a set of currents of second selected values to flow in said second set of transistors to said output terminal of a respective one of said transconductance amplifiers.

13. A method as in claim 12 wherein said step of providing said feedback signals comprises the step of drawing said currents through said first set of transistors through a first set of resistors, each coupled between an associated one of said supply voltage leads and said second differential input lead of an associated one of said transconductance amplifiers.

14. A method as in claim 12 wherein said step of providing said signals to said first differential input leads of said transconductance amplifiers comprises the step of providing a respective one of said signals to a first end of a resistor which is also connected to said first differential input lead of said an associated one of transconductance amplifiers, and drawing said input current through said resistor from said an associated one of supply voltage leads.

15. A method as in claim 12 wherein said step of providing a drive signal causes said transistor of said first set of transistors associated with said first transconductance amplifier to conduct current to said output terminal.

16. A method as in claim 12 which further comprises the step of providing said drive signal to a current sense transistor, thereby causing a current to flow in said current sense transistor which is indicative of the current flow through said first transistor of said second set of transistors associated with said first transconductance amplifier.

17. A method as in claim 12 wherein said step of providing said drive signal to said transistor of said second set of transistors comprises providing said drive signal which is derived from a voltage in excess of said first supply voltage associated with said first transconductance amplifier.

18. A method as in claim 17 wherein said step of providing said drive signal comprises the step of:
providing a bias voltage to the base of a transistor which also has an emitter coupled to said supply voltage lead associated with said first transconductance amplifier, and a first collector coupled to said output lead of said transconductance amplifier, and a second collector;
providing a current path coupled between said first collector and ground, and causing said current path to draw current in response to said input current; and providing a current control circuit coupled to said second collector and said voltage in excess of said first supply voltage to provide current from said first supply voltage in excess of said first supply voltage to said output lead of said transconductance amplifier in response to current from said second collector.

19. A method as in claim 12 wherein said step of providing a drive signal causes said transistor of said first set of transistors associated with said second transconductance amplifier to conduct current from said output terminal.

20. A voltage regulator comprising:
a supply voltage lead;
a ground lead;
a charge pump for providing a pumped supply voltage greater than said supply voltage;
an output terminal for providing an output voltage of a desired voltage level between the voltage levels of said supply voltage and ground;
a differential amplifier including a first differential input lead receiving a reference voltage related to the desired output voltage, a second differential input lead for receiving a voltage related to the output voltage appearing on said output terminal, and an output lead for providing a control signal for controlling the output voltage on said output lead; and
a current amplifier comprising:
an input lead coupled to said output lead of said differential amplifier;
an output terminal coupled to said output terminal of said voltage regulator;
a transconductance amplifier powered by said pumped supply voltage, comprising:
a first differential input lead coupled to said input lead;
a second differential input lead;
an output lead;
a transistor having a base receiving a bias voltage, an emitter coupled to said supply voltage lead, a first collector coupled to said output lead of said transconductance amplifier, and a second collector formed as an outer concentric collector surrounding said first collector and said emitter;
a current path coupled between said first collector and ground, said current path drawing current in response to said input current; and
a current control circuit coupled to said second collector and said charge pump to provide current from said charge pump to said output lead of said transconductance amplifier in response to current from said second collector;
a first resistor connected between said first differential input lead of said transconductance amplifier and said supply voltage lead;
a second resistor connected between said second differential input lead of said transconductance amplifier and said supply voltage lead;
a first transistor having a first current handling lead coupled to said second differential input lead of said transconductance amplifier, a second current handling lead connected to draw current through said first transistor, and a control lead coupled to said output lead of said transconductance amplifier; and
a second transistor having a first current handling lead coupled to said supply voltage lead, a second current handling lead connected to said output terminal, and a control lead coupled to said output lead of said transconductance amplifier,
wherein said transconductance amplifier drives said control terminals of one or both of said first and second transistors to a voltage level in excess of said supply voltage.

21. A voltage regulator as in claim 20 wherein said second current handling lead of said first transistor is coupled to said output terminal.

22. A voltage regulator as in claim 20 wherein said second transistor sources current to said output terminal in response to said input current.

23. A voltage regulator as in claim 20 wherein said second transistor sinks current from said output terminal in response to said input current.

24. A voltage regulator as in claim 20 wherein said first and second transistors comprise MOS transistors.

* * * * *